(12) United States Patent
Racey et al.

(10) Patent No.: US 10,846,189 B2
(45) Date of Patent: Nov. 24, 2020

(54) METHOD AND SYSTEM FOR AUTOMATED TEST OF END-USER DEVICES

(71) Applicant: Contec, LLC, Schenectady, NY (US)

(72) Inventors: Darby Racey, Voorheesville, NY (US); Vladzimir Valakh, Troy, NY (US); Vicente Miranda, Clifton Park, NY (US); Rafael Villanueva, Clifton Park, NY (US)

(73) Assignee: Contec LLC, Schenectady, NY (US)

( * ) Notice: Subject to any disclaimer, the term of this patent is extended or adjusted under 35 U.S.C. 154(b) by 466 days.

(21) Appl. No.: 15/817,173

(22) Filed: Nov. 18, 2017

(65) Prior Publication Data

US 2018/0074928 A1 Mar. 15, 2018

Related U.S. Application Data

(63) Continuation of application No. 12/566,041, filed on Sep. 24, 2009, now Pat. No. 9,836,376.

(51) Int. Cl.
*G06F 11/273* (2006.01)
*G01R 31/319* (2006.01)
*G06F 11/263* (2006.01)
*G06F 11/27* (2006.01)
*G06F 30/34* (2020.01)

(52) U.S. Cl.
CPC .......... *G06F 11/273* (2013.01); *G01R 31/319* (2013.01); *G06F 11/263* (2013.01); *G06F 11/27* (2013.01); *G06F 11/2733* (2013.01); *G06F 30/34* (2020.01)

(58) Field of Classification Search
USPC ......................................................... 702/119
See application file for complete search history.

(56) References Cited

U.S. PATENT DOCUMENTS

| | | | |
|---|---|---|---|
| 4,382,227 A * | 5/1983 | Olivenbaum | G01R 1/206 324/110 |
| 5,983,022 A | 11/1999 | Watkins | |
| 6,057,882 A | 5/2000 | Van Den Branden Lambrecht | |
| 6,367,032 B1 | 4/2002 | Kasahara | |
| 6,385,739 B1 | 5/2002 | Barton | |
| 6,662,135 B1 | 12/2003 | Burns | |
| 6,728,767 B1 | 4/2004 | Day | |
| 7,020,573 B2 | 3/2006 | Wheeler | |

(Continued)

FOREIGN PATENT DOCUMENTS

CA 2739188 4/2020
CN 202261360 5/2012

(Continued)

OTHER PUBLICATIONS

Tiwari, Rajeev; Final Office Action for U.S. Appl. No. 15/099,418, filed Apr. 14, 2016, dated Oct. 10, 2018, 28 pgs.

(Continued)

*Primary Examiner* — Paul D Lee
(74) *Attorney, Agent, or Firm* — Taylor English Duma LLP

(57) ABSTRACT

A test system, for example for set top boxes or game consoles, includes logic to reformat media signals output by a device under test, logic to receive the reformatted media signals and to analyze them for errors, and a pluggable interface coupling and device under test to the logic to reformat the media signals.

17 Claims, 3 Drawing Sheets

(56) References Cited

U.S. PATENT DOCUMENTS

| | | |
|---|---|---|
| 7,103,802 B2 | 9/2006 | Stephens |
| 7,222,255 B1 | 5/2007 | Claessens |
| 7,664,317 B1 | 2/2010 | Sowerby |
| 7,770,066 B2 | 8/2010 | Mun |
| 8,209,732 B2 | 6/2012 | Le |
| 8,229,344 B1 | 7/2012 | Petersen |
| 8,324,909 B2 | 12/2012 | Oakes |
| 8,418,219 B1 | 4/2013 | Parsons |
| 8,515,015 B2 | 8/2013 | Maffre |
| 8,595,784 B2 | 11/2013 | Vanderhoff |
| 8,689,071 B2 | 4/2014 | Valakh |
| 8,806,400 B1 | 8/2014 | Bhawmik |
| 8,978,081 B2 | 3/2015 | McClay |
| 9,836,375 B2 | 12/2017 | Racey et al. |
| 9,836,376 B2 | 12/2017 | Racey et al. |
| 10,103,967 B2 | 10/2018 | Huh et al. |
| 10,284,456 B2 | 5/2019 | Huh et al. |
| 10,462,456 B2 | 10/2019 | Tiwari et al. |
| 10,757,002 B2 | 8/2020 | Huh et al. |
| 2001/0034847 A1 | 10/2001 | Gaul, Jr. |
| 2002/0055834 A1 | 5/2002 | Andrade |
| 2002/0070725 A1 | 6/2002 | Hilliges |
| 2003/0005380 A1 | 1/2003 | Nguyen |
| 2003/0014208 A1* | 1/2003 | Glynn ............... G06F 11/273 702/120 |
| 2003/0036875 A1 | 2/2003 | Peck |
| 2003/0182601 A1 | 9/2003 | Richardson |
| 2004/0010323 A1 | 1/2004 | Martin et al. |
| 2004/0016708 A1 | 1/2004 | Rafferty |
| 2004/0060069 A1 | 3/2004 | Abramson |
| 2005/0138193 A1 | 6/2005 | Encarnacion |
| 2005/0193294 A1 | 9/2005 | Hildebrant |
| 2005/0286466 A1 | 12/2005 | Tagg |
| 2006/0015785 A1 | 1/2006 | Chun |
| 2006/0279301 A1 | 12/2006 | Treilbergs |
| 2007/0097659 A1 | 5/2007 | Behrens |
| 2007/0124114 A1 | 5/2007 | Shapiro |
| 2007/0210811 A1* | 9/2007 | Cojocneanu ....... G01R 31/2887 324/750.16 |
| 2007/0220380 A1 | 9/2007 | Ohanyan |
| 2007/0230357 A1 | 10/2007 | Lin |
| 2008/0031151 A1 | 2/2008 | Williams |
| 2008/0064395 A1 | 3/2008 | Sibileau |
| 2008/0133165 A1* | 6/2008 | Iwamoto ......... G01R 31/31908 702/118 |
| 2008/0140736 A1* | 6/2008 | Jarno ............... G06F 11/1456 |
| 2008/0315898 A1 | 12/2008 | Cannon |
| 2009/0013372 A1 | 1/2009 | Oakes |
| 2009/0089854 A1 | 4/2009 | Le |
| 2009/0282455 A1 | 11/2009 | Bell et al. |
| 2010/0046729 A1 | 2/2010 | Bifano et al. |
| 2010/0138823 A1 | 6/2010 | Thornley |
| 2010/0161769 A1 | 6/2010 | Qian et al. |
| 2010/0164527 A1* | 7/2010 | Weyh .............. G01R 31/31907 324/750.3 |
| 2011/0001833 A1 | 1/2011 | Grinkemeyer |
| 2011/0006794 A1 | 1/2011 | Sellathamby |
| 2011/0012632 A1 | 1/2011 | Merrow |
| 2011/0035676 A1 | 2/2011 | Tischer |
| 2011/0072306 A1 | 3/2011 | Racey |
| 2011/0099424 A1 | 4/2011 | Rivera Trevino |
| 2011/0276684 A1 | 11/2011 | Singh |
| 2012/0140081 A1 | 1/2012 | Clements |
| 2012/0076015 A1 | 3/2012 | Pfeffer |
| 2012/0131197 A1 | 5/2012 | Prentice et al. |
| 2012/0163227 A1 | 6/2012 | Kannan |
| 2012/0198442 A1 | 8/2012 | Kashyap |
| 2012/0213259 A1 | 8/2012 | Renken et al. |
| 2012/0233679 A1 | 9/2012 | Shedrinsky |
| 2012/0275784 A1 | 11/2012 | Soto |
| 2012/0278826 A1 | 11/2012 | Jones |
| 2013/0063606 A1 | 3/2013 | McClay et al. |
| 2013/0076217 A1 | 3/2013 | Thompson |
| 2013/0104158 A1 | 4/2013 | Partee |
| 2013/0111275 A1 | 5/2013 | Ganesan et al. |
| 2013/0160064 A1 | 6/2013 | Van Rozen |
| 2013/0167123 A1 | 6/2013 | Dura |
| 2013/0178203 A1 | 7/2013 | Venkataraman |
| 2014/0115580 A1 | 4/2014 | Kellerman |
| 2014/0123200 A1 | 5/2014 | Park |
| 2014/0132291 A1 | 5/2014 | Somachudan et al. |
| 2014/0156819 A1 | 6/2014 | Cavgalar |
| 2014/0162628 A1 | 6/2014 | Bevelacqua et al. |
| 2014/0167794 A1 | 6/2014 | Nath et al. |
| 2014/0187173 A1 | 7/2014 | Partee |
| 2014/0207404 A1 | 7/2014 | Fritzsche |
| 2014/0256373 A1 | 9/2014 | Hernandez |
| 2014/0282783 A1 | 9/2014 | Totten |
| 2014/0370821 A1 | 12/2014 | Guterman |
| 2015/0109941 A1 | 4/2015 | Zhang |
| 2015/0146712 A1 | 5/2015 | Jin |
| 2015/0288589 A1 | 10/2015 | Radford et al. |
| 2016/0048397 A1 | 2/2016 | Morales |
| 2016/0150419 A1 | 5/2016 | Thangarasa et al. |
| 2016/0234163 A1 | 8/2016 | Nistor |
| 2016/0286285 A1 | 9/2016 | Geyzel |
| 2016/0299482 A1 | 10/2016 | Sun |
| 2017/0048519 A1 | 2/2017 | Friel |
| 2017/0126539 A1 | 5/2017 | Tiwari |
| 2017/0249226 A1 | 8/2017 | Racey |
| 2017/0302916 A1 | 10/2017 | Tiwari |
| 2017/0302917 A1 | 10/2017 | Tiwari |
| 2018/0131594 A1 | 5/2018 | Huh et al. |
| 2018/0131596 A1 | 5/2018 | Huh et al. |
| 2019/0230022 A1 | 7/2019 | Huh et al. |

FOREIGN PATENT DOCUMENTS

| | | |
|---|---|---|
| EP | 0989563 | 3/2000 |
| WO | 2001013604 | 2/2001 |
| WO | 2013169728 | 11/2013 |
| WO | 2014065843 | 5/2014 |

OTHER PUBLICATIONS

Huh, Ina; Non-Final Office Action for U.S. Appl. No. 15/348,950, filed Nov. 10, 2016, dated Sep. 4, 2018, 14 pgs.

Huh, Ina; Issue Notification for U.S. Appl. No. 15/624,971, filed Jun. 16, 2017, dated Sep. 26, 2018, 1 pg.

Huh, Ina; Corrected Notice of Allowance for U.S. Appl. No. 15/348,950, filed Nov. 10, 2016, dated Mar. 26, 2019, 6 pgs.

Huh, Ina; Corrected Notice of Allowance for U.S. Appl. No. 15/348,950, filed Nov. 10, 2016, dated Apr. 1, 2019, 6 pgs.

Huh, Ina; Issue Notification for U.S. Appl. No. 15/348,950, filed Nov. 10, 2016, dated Apr. 17, 2019, 1 pg.

Tiwari, Rajeev; Advisory Action for U.S. Appl. No. 15/099,384, filed Apr. 14, 2016, dated Jan. 31, 2018, 4 pgs.

Tiwari, Rajeev; Non-Final Office Action for U.S. Appl. No. 15/099,418, filed Apr. 14, 2016, dated Apr. 9, 2018, 22 pgs.

Huh, Ina; Non-Final Office Action for U.S. Appl. No. 15/348,950, field Nov. 10, 2016, dated Apr. 5, 2018, 39 pgs.

Huh, Ina; Final Office Action for U.S. Appl. No. 15/624,971, filed Jun. 16, 2017, dated Jan. 25, 2018, 45 pgs.

Valakh, Vladzimir; Office Action for Canadian patent application No. 2,739,188, filed May 5, 2011, dated Jan. 30, 2018, 4 pgs.

Huh, Ina; Corrected Notice of Allowability for U.S. Appl. No. 15/624,971, filed Jun. 16, 2017, dated Jun. 26, 2018, 12 pgs.

Huh, Ina; Notice of Allowance for U.S. Appl. No. 15/624,971, filed Jun. 16, 2017, dated May 24, 2018, 9 pgs.

Tiwari, Rajeev; Final Office Action for U.S. Appl. No. 15/099,384, filed Apr. 14, 2016, dated Oct. 3, 2017, 29 pgs.

Tiwari, Rajeev; Non-Final Office Action for U.S. Appl. No. 15/099,384, filed Apr. 14, 2016, dated Feb. 22, 2017, 13 pgs.

Tiwari, Rajeev; Non Final Office Action for U.S. Appl. No. 15/099,418, filed Apr. 14, 2016, dated Nov. 14, 2017, 39 pgs.

Compaq Computer Corporation; Plug and Play Bios Specification, Version 1.0A, May 5, 1994, 56 pgs.

Metrobility Optical Systems; Specification for "twister" 2131 100Mbps Multimode-to-Singlemode Media Converter, Apr. 2002, 16 pgs.

(56) References Cited

OTHER PUBLICATIONS

Racey, Darby; Advisory Action for U.S. Appl. No. 12/566,041, filed Sep. 24, 2009, dated Nov. 30, 2012, 2 pgs.
Racey, Darby; Final Office Action for U.S. Appl. No. 12/566,041, filed Sep. 24, 2009, dated Nov. 21, 2014, 15 pgs.
Racey, Darby; Final Office Action for U.S. Appl. No. 12/566,041, filed Sep. 24, 2009, dated May 5, 2016, 16 pgs.
Racey, Darby; Final Office Action for U.S. Appl. No. 12/566,041, filed Sep. 24, 2009, dated Sep. 7, 2012, 7 pgs.
Racey, Darby; Issue Notification for U.S. Appl. No. 12/566,041, filed Sep. 24, 2009, dated Nov. 15, 2017, 1 pg.
Racey, Darby; Non-final Office Action for U.S. Appl. No. 12/566,041, filed Sep. 24, 2009, dated Oct. 31, 2011, 8 pgs.
Racey, Darby; Non-final Office Action for U.S. Appl. No. 12/566,041, filed Sep. 24, 2009, dated Dec. 15, 2016, 13 pgs.
Racey, Darby; Non-final Office Action for U.S. Appl. No. 12/566,041, filed Sep. 24, 2009, dated Jan. 4, 2014, 12 pgs.
Racey, Darby; Non-final Office Action for U.S. Appl. No. 12/566,041, filed Sep. 24, 2009, dated Sep. 23, 2015, 17 pgs.
Racey, Darby; Non-final Office Action for U.S. Appl. No. 12/566,041, filed Sep. 24, 2009, dated Sep. 6, 2013, 9 pgs.
Racey, Darby; Notice of Allowance and Fees Due for U.S. Appl. No. 12/566,041, filed Sep. 24, 2009, dated Sep. 18, 2017, 14 pgs.
Racey, Darby; Notice of Allowance for U.S. Appl. No. 12/566,041, filed Sep. 24, 2009, dated Jun. 16, 2017, 21 pgs.
Racey, Darby; Response to Amendment under Rule 312 for U.S. Appl. No. 12/566,041, filed Sep. 24, 2009, dated Nov. 1, 2017, 8 pgs.
Racey, Darby; Restriction Requirement for U.S. Appl. No. 12/566,041, filed Sep. 24, 2009, dated Feb. 15, 2012, 5 pgs.
Racey, Darby; Issue Notification for U.S. Appl. No. 15/593,562, filed May 12, 2017, dated Nov. 15, 2017, 1 pg.
Racey, Darby; Notice of Allowance for U.S. Appl. No. 15/593,562, filed May 12, 2017, dated Aug. 9, 2017, 21 pgs.
Racey, Darby; Notice of Allowance for U.S. Appl. No. 15/593,562, filed May 12, 2017, dated Sep. 8, 2017, 13 pgs.
Racey, Darby; Response to Amendment under Rule 312 for U.S. Appl. No. 15/593,562, filed May 12, 2017, dated Oct. 31, 2017, 7 pgs.
Huh, Ina; Non-Final Office Action for U.S. Appl. No. 15/624,971, filed Jun. 16, 2017, dated Sep. 12, 2017, 28 pgs.
Kumar, Samant; International Search Report and Written Opinion for PCT/US16/53768, filed Sep. 26, 2016, dated Feb. 3, 2017, 17 pgs.
Valakh, Vladzimir; Office Action for Canadian Patent Application No. 2,739,188, filed May 5, 2011, dated Feb. 24, 2017, 2 pgs.
Kumar, Samant; International Search Report and Written Opinion for PCT/US2016/058507, filed Oct. 24, 2016, dated Jan. 3, 2017, 12 pgs.
Businesswire; Article entitled: "GENBAND and CTDI Settle Legal Dispute", located at <http://www.businesswire.com/news/home/20140321005528/en/GENBAND-CTDI-Settle-Legal-Dispute>, Mar. 21, 2014, 1 pg.
CED Magazine; Article entitled: "Cable Connects in Atlanta", located at <https://www.cedmagazine.com/article/2006/04/cable-connects-atlanta>, Apr. 30, 2006, 21 pgs.
Consumer Electronics Net; Article entitled: "Teleplan Enhances Test Solution Portfolio with Titan", located at <http://www.consumerelectronicsnet.com/article/Teleplan-Enhances-Test-Solution-Portfolio-With-Titan-4673561>, published on Nov. 1, 2016, 3 pgs.
Digital Producer; Article entitled: "S3 Group Unveils Exclusive Partnership in North America With First US StormTest(TM) Decision Line Customer", located at <http://www.digitalproducer.com/article/S3-Group-Unveils-Exclusive-Partnership-in-North-America-With-First-US-StormTest(TM)-Decision-Line-Customer--1668213>, Sep. 8, 2011, 3 pgs.
Electronic Design; Article entitled: "Testing of MPEG-2 Set-Top Boxes Must be Fast, Thorough", located at <http://www.electronicdesign.com/print/839>, published Nov. 18, 2001, 9 pgs.
Euromedia; Article entitled: "Automated TV Client testing: Swisscom partners with S3 Group to deliver the ultimate IPTV experience", located at <http://advanced-television.com/wp-content/uploads/2012/10/s3.pdf>, earliest known pub. date—May 30, 2013, 2 pgs.
Exact Ventures; Report entitled: North American Telecommunications Equipment Repair Market, located at http://www.fortsol.com/wp-content/uploads/2016/08/Exact-Ventures-NA-Repair-Market-Report.pdf>, earliest known publication date Aug. 1, 2016, 12 pgs.
Nordman, Bruce, "Testing Products with Network Connectivity," Jun. 21, 2011 [retrieved online at http://citeseerx.is1.psu.edu/viewdoc/download?doi=10.1.1.695.772&rep=rep1&type=pdf on Feb. 6, 2017], 20 pgs.
Promptlink Communications; Article entitled: "Promptlink Communications Officially Launches Sep-Top Box Testing Platform", located at <https://www.promptlink.com/company/assets/media/2014-05-20.pdf>, published on May 20, 2014, 2 pgs.
Promptlink; Article entitled: "Cable Modem Test Platform", located at <https://www.promptlink.com/products/cmtp.html>, earliest known publication date Aug. 11, 2016, 10 pgs.
Promptlink; Article entitled: "Set-Top Box Test Platform", located at <http://promptlink.com/products/stbtp.html>, earliest known publication date Aug. 11, 2016, 7 pgs.
S3 Group; Document entitled: "White Paper: The Importance of Automated Testing in Set-Top Box Integration", earliest known publication date Jun. 17, 2014, 11 pgs.
Teleplan; Article entitled: "Screening & Testing", located at <https://www.teleplan.com/innovative-services/screening-testing/>, earliest known publication date Mar. 21, 2015, 7 pgs.
TVTECHNOLOGY; Article entitled: "S3 Group's StormTest", located at <http://www.tvtechnology.com/expertise/0003/s3-groups-stormtest/256690>, published May 1, 2012, 2 pgs.
Tiwari, Rajeev; Notice of Allowance for U.S. Appl. No. 15/099,418, filed Apr. 14, 2016, dated Jun. 24, 2019, 16 pgs.
Tiwari, Rajeev; Non-Final Office Action for U.S. Appl. No. 15/099,418, filed Apr. 14, 2016, dated Feb. 28, 2019, 27 pgs.
Huh, Ina; Corrected Notice of Allowance for U.S. Appl. No. 15/348,950, filed Nov. 10, 2016, dated Feb. 14, 2019, 5 pgs.
Huh, Ina; Notice of Allowance for U.S. Appl. No. 15/348,950, filed Nov. 10, 2016, dated Jan. 8, 2019, 14 pgs.
Valakh, Vladzimir; Office Action for Canadian Patent Application No. 2,739,188, filed May 5, 2011, dated Dec. 20, 2018, 3 pgs.
Tiwari, Rajeev; Notice of Allowance for U.S. Appl. No. 15/099,384, filed Apr. 14, 2016, dated May 11, 2020, 10 pgs.
Tiwari, Rajeev; Notice of Allowance for U.S. Appl. No. 15/099,384, filed Apr. 14, 2016, dated May 18, 2020, 18 pgs.
Huh, Ina; Notice of Allowance for U.S. Appl. No. 16/369,607, filed Mar. 29, 2019, dated Apr. 27, 2020, 38 pgs.
Tiwari, Rajeev; Corrected Notice of Allowance for U.S. Appl. No. 15/099,384, filed Apr. 14, 2016, dated Aug. 19, 2020, 6 pgs.
Tiwari, Rajeev; Supplemental Notice of Allowance for U.S. Appl. No. 15/099,384, filed Apr. 14, 2016, dated Jul. 21, 2020, 6 pgs.
Huh, Ina; Corrected Notice of Allowance for U.S. Appl. No. 16/369,607, filed Mar. 29, 2019, dated Jul. 10, 2020, 6 pgs.

* cited by examiner

METHOD AND SYSTEM FOR AUTOMATED TEST OF END-USER DEVICES

CROSS-REFERENCE

This application is a continuation of U.S. patent application Ser. No. 12/566,041, filed Sep. 24, 2009, and hereby incorporated in its entirety by reference.

FIELD

This application relates to automated test equipment.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
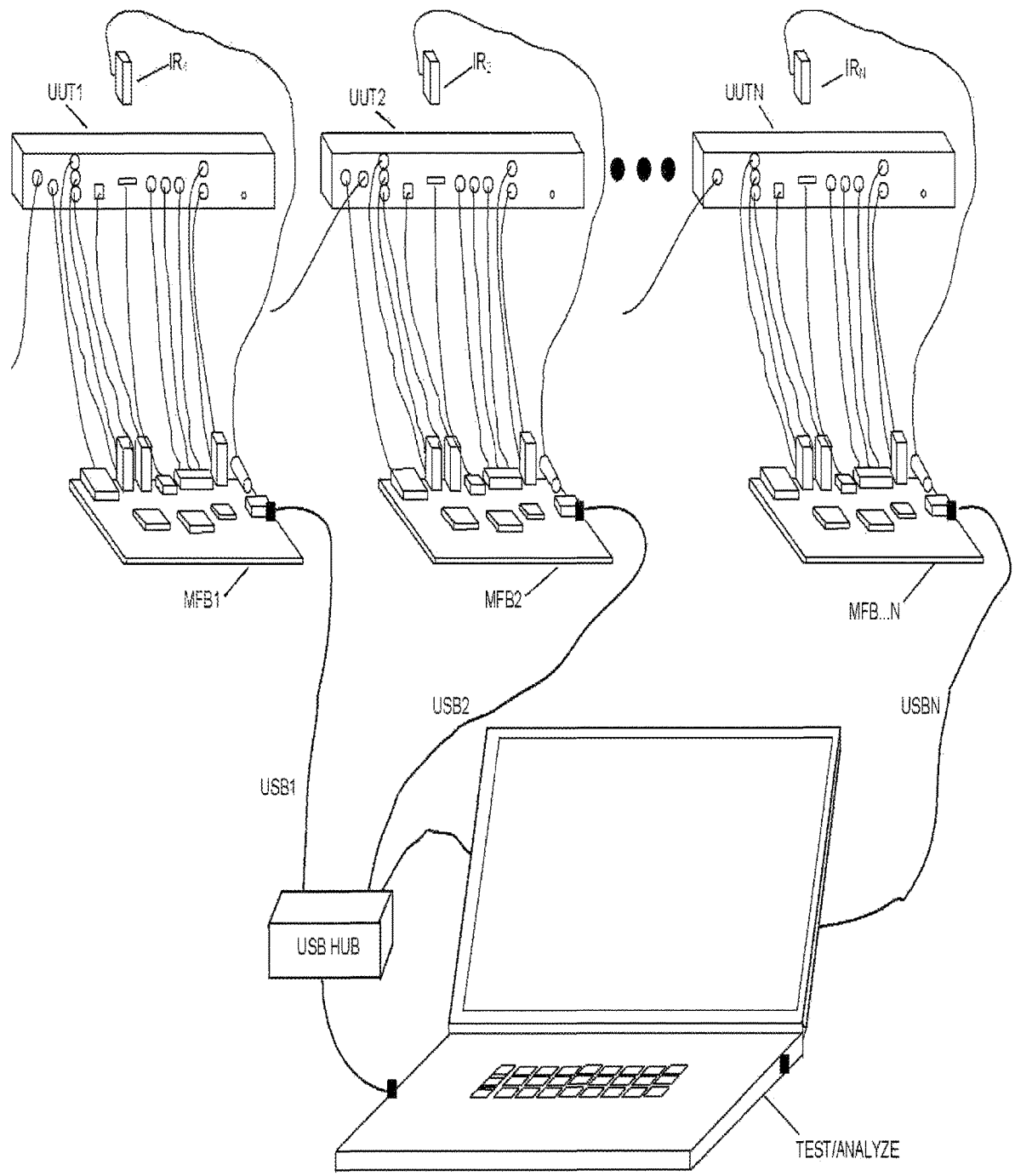
FIG. 1 illustrates a prior-art test system for end-user devices such as set top boxes and game consoles.

FIG. 1 illustrates a test system for user devices such as set top boxes and game consoles. Multiple units under test (UUT1, UUT2, . . . UUTN) are coupled to multiple multi-media-format boards: MFB1, MFB2, . . . MFBN. The multi-media-format boards may each offer a set of media format conversion functionality. The connectivity employed between a particular UUT and its associated MFB may vary according to the make and model of the UUT and or MFB. Some UUTs may receive signals which are not directed from or through the MFB with which they are associated, for example signals from a service provider head-end. The inputs to a MFB, UUT, and the connections between an MFB and UUT, may vary according to the make and model of UUT, complicating the testing process.

Polling, control, initialization, and configuration signals provided by the service provider (e.g., a cable television network operator, an Internet Service Provider, etc.) to the UUT are supplied via a direct connection between the UUT and the service provider network.

In order to swap a UUT with another for testing purposes, it may be necessary to manually reconfigure the connections between the UUT and the MFB, and the UUT and the service provider.

Each MFB may be coupled to test logic (e.g. a laptop computer), for example via a Universal Serial Bus (USB). Each MFB may drive an infrared (IR) signal source (IR1, IR2 . . . IRN) to control the UUT. A USB hub may be employed to expand the number of ports available on a laptop, personal computer, or other test device.

Figure 2:
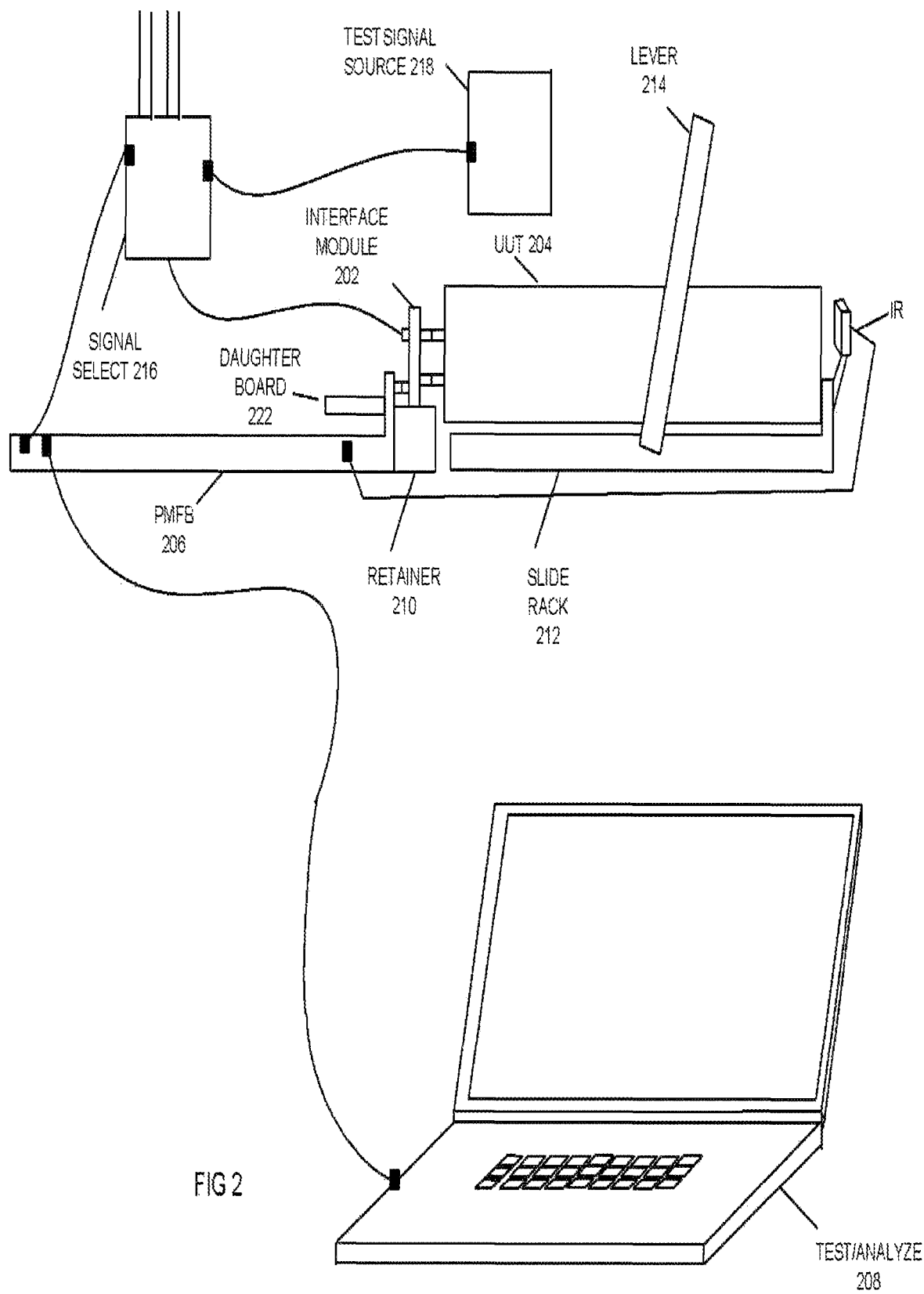
FIG. 2 illustrates an embodiment of a novel automated test system for end-user devices.

FIG. 2 illustrates an embodiment of a novel automated test system for end-user devices. Inputs to a unit under test (UUT) are received at a pluggable interface module 202, which adapts and positions the signals to be received by the UUT 204. The interface module 202 comprises inputs to and outputs from the UUT 204.

A multi-media format board 206 (MFB) may be configured with logic that is downloaded and installed on the board 206, making it a programmable multi-media format board (PMFB). This may enable use of a single PMFB with multiple makes and models of UUT. The PMFB 206 may be configured to provide all of the inputs that the UUT 204 receives, and to receive all outputs of interest for testing from the UUT 204. In this manner, it may be possible to simple disengage a particular UUT from the interface module 202, and plug in anew UUT, without manually removing or installing any cabling or connections to the UUT 204 or PMFB 206.

The interface module 202 may comprise an identification (e.g. an assembly part number) that corresponds to the supported model. This identification may be coded into a non-volatile memory of the interface module 202. The PMFB 206 may be adapted to automatically detect the make and model of a UUT 204 coupled thereto by interacting with the UUT 204 and/or with the interface module 202, and may download and/or activate appropriate logic (e.g. from the test/analysis logic 208) to interact with and facilitate the testing of the UUT 204. Upon detecting the make and model of a UUT 204, the PMFB 206 may inform the test/analysis logic 208 of this information, so that the test/analysis logic 208 may select appropriate test and analysis logic for the UUT 204. Logic of the test system may provide for parallel processing, such that each UUT 204 may be tested independently and concurrently. Multi-threading may be employed to accomplish this.

The PMFB 206 may convert outputs of the UUT 204 to a binary format suitable for processing and analysis by the test/analysis logic 208. Each PMFB 206 may have associated test logic, or multiple PMFBs may output data in parallel to shared test/analysis logic. Outputs of the PMFB 206 to test/analysis logic 208 may be provided in some embodiments via universal serial bus (USB). The pluggable interface module 202 may be adapted to fit, e.g. slot into, a retainer 210. The interface module 202 is interchangeable and may be specific to a make and model of UUT 204, whereas the retainer 210 may comprise a universal configuration (inputs and outputs) common among all makes and models of UUT 204. A slide rack 212 driven by a lever 214, crank, or other mechanism may be provided for loading the UUT 204 and for mechanically engaging it with the interface module 202 via operation of the lever 214 or other control The lever 214 or other control may likewise be employed to disengage the UUT 204 from the interface module 202, at which point the UUT 204 and/or the modular interface 202 may be removed and replaced with another UUT 204 and/or interface module 202.

The PMFB 206 may comprise logic for the decoding and reformatting of various media formats, such as Component, Composite, S-video, HDMI, and analog video. The format logic may also support S/PDIF and/or coaxial/optical audio formats, to name just some examples. Logic to decode different media formats may be downloaded by the PivlFB 206 in some embodiments. Thus, a single PMFB 206 may be employed with various UUTs that operate upon or output various media formats.

Polling, control. Initialization, and configuration signals provided by the service provider (e.g., a cable television network operator, an Internet Service Provider, etc.) to the UUT are provided via a source signal selector 216. The source signal selector 216 may choose from among multiple available service provider sources and direct signals from the chosen source to the interface module 202 (note that the signals from the chosen source may in some implementations be directed to the retainer 210, which may comprise inputs and outputs common to all makes and models of UUT 204. For example, the source signal selector 216 may choose signals from a particular head end of a cable television provider, depending upon the make/model of the UUT 204. The source signal selector 216 may choose signals from different service providers depending on the type of UUT (e.g. settop box, game console, etc.). The source signal selector 216 may comprise a configurable RF attenuation control to stress the RF input of the unit under test. This may be employed to detect anomalies on units failing when the RF level is below certain threshold levels.

A carousel server (OLL, e.g. a Motorola Offline Loader, not shown in drawings) may be employed to load code objects on various set-top boxes. Deploying an OLL may increase the throughput of loading desired code objects independent from a service provider source. The signal selector 216 may be used in conjunction with the OLL to help prepare the set-top boxes with specific code objects.

Either or both of the PMFB 206 or source signal selector 216 may determine the make and/or model of the UUT 204. If the PMFB 206 makes this determination, it may in some embodiments communicate the make/model information to the source signal selector 216 and/or direct the source signal selector 216 to select a particular source. If the source signal selector 216 makes this determination, it may, in some embodiments, communicate the information to the PMFB 206 and/or direct the PMFB 206 to select a particular source. Media signals may be provided via a tunable RF channel from a local source 218, instead of from the provider network. The local source need not be "local" to the test system, but may be any source other than the service provider network. The local media test signals may be substituted for signals from the provider network (e.g. the provider signals may be filtered out and replaced), or the local signals may supplement the polling, control, initialization, and configuration signals normally provided by the service provider.

The source 218 of the local media test signals may be a separate server for this purpose, and/or the test/analysis logic 208 or devices may provide the local media test signals. In some embodiments, the media test signals may be selected according to the make and/or model of the UUT 204. The system may include logic to apply the media test signals to the UUT via a same physical medium as service provider configuration signals are applied to the UUT. This logic may be comprised by the source signal selector 216, the pluggable interface module 202, the media format board 206, or some other device (e.g. an RF coupler in the signal path).

Control signals that drive features of the UUT 204 may be provided, for example by an IR port and/or USB from the PMFB 206. PCT or SPI control and data exchange may also be employed to interact with the UUT 204. The PMFB 206 may operate as a frame grabber which captures one or more frames output by the UUT 204, buffers the captured frame (s), converts them to a data stream, and transfers them to the test/analysis logic 208, for example via a USB interface.

Logic to capture and process new/updated or different media formats, or to interact with new/different makes and models of UUT 204, may be dynamically loaded to the PMFB 206 by the test/analysis logic 208 or another device. Dynamic loading of logic to the PMFB 206 may be based upon a determination of the make and/or model number of the UUT204.

A test platform employing features of the described test system embodiment(s) may be arranged in horizontal, vertical, and/or grid configurations, with one, two, four, eight, or up to 24 UUT test stations, to name some of the possibilities.

Figure 3:
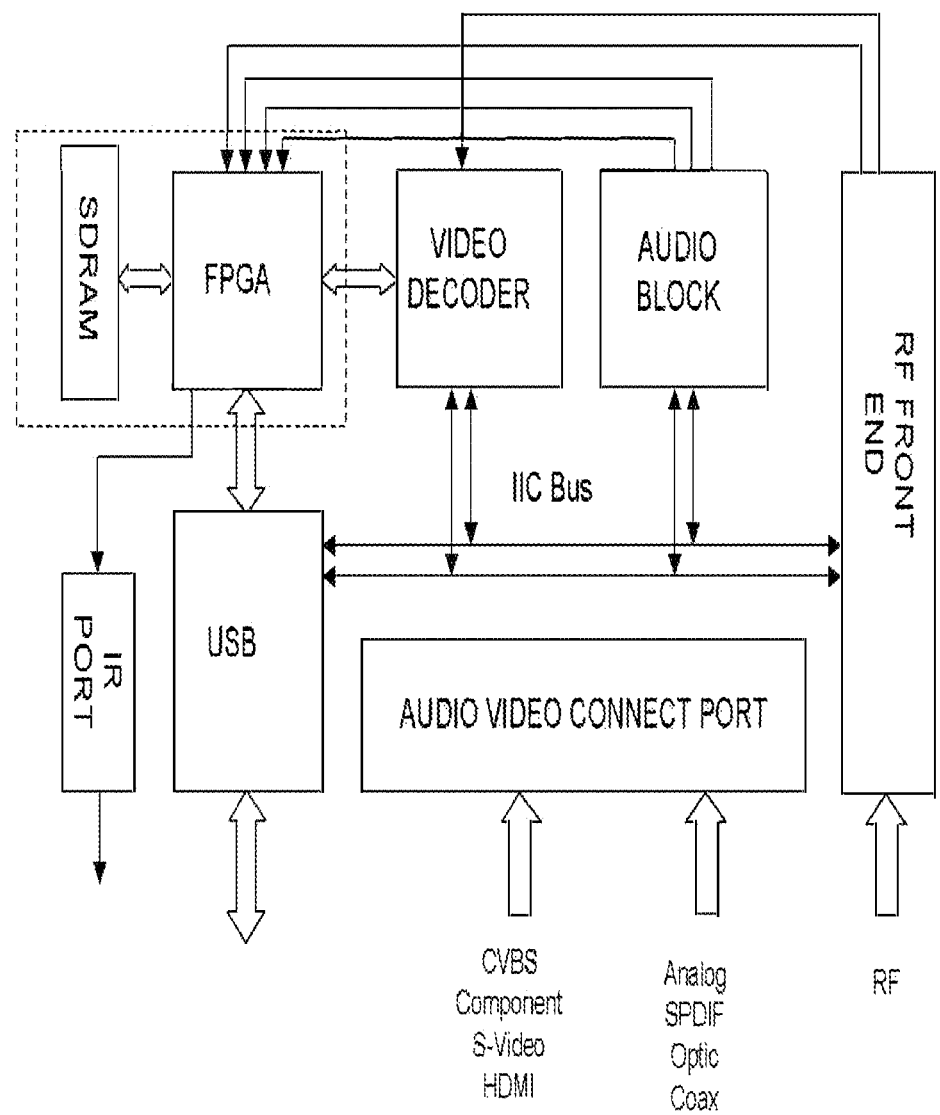
FIG. 3 illustrates an embodiment of a novel programmable multiformat board.

FIG. 3 illustrates an embodiment of a novel programmable multi-media format board. Various components readily apparent to those skilled in the art are omitted from the illustration for purposes of keeping the description concise. The board may be programmed with new/changed media processing logic via parallel port, USB, or other digital interfaces, which may communicate and store upgrades to SDRAM, FLASH memory (not shown), or other volatile or nonvolatile program memory (e.g. memory of audio and video decoder blocks). Various board functions are coordinated using logic comprised by an FPGA, EPROM, EEPROM, ASIC, or other program memory storage. An IR port is available for communicating commands wirelessly to a UUT.

The board has a capability to receive and decode various media formats, such as CVBS, Component. S-Video, HDMI (high definition multimedia interface), S/PDIF, Digital audio, PCM, Dolby, and DTS. A secure daughter board 222 may be used to decode and test HDMI signals, with the decoded result then passed to the MFB. The HDMI daughter board tests the signal to comply with HDCP (high bandwidth digital content protection), because the decoded HDMI signal cannot be passed to a PC, laptop, or other unsecure digital platform without violation of the HDCP specification. The board may also have a capability to receive and decode analog, SPDIF, optical signals, as well as RF signals (e.g. via coaxial cable).

The board may comprise logic (e.g. in FPGA) to determine the make and model of a coupled UUT, and to adapt the applied media decoding logic accordingly, and to communicate the make and model information to a signal source for the UUT (or cause the signal source to select a signal suitable to the make and/or model of the UUT). This make and model information may be obtained from the UUT, or from the pluggable interface module, or from another source, depending on the implementation.

The board may comprise logic (e.g. in FPGA) to adapt the applied media decoding logic based upon instructions from a signal source or other external device.

A test system includes logic to reformat media signals output by a device under test, logic to receive the reformatted media signals and to analyze them for errors, a pluggable interface coupling the device under test to the logic to reformat the media signals, and logic to analyze output signals of the device under test to detect a make and/or model of the device under test.

"Logic" refers to signals and/or information embodied in circuits (e.g. memory circuits) that may be applied to influence the operation of a device. Software, hardware, and firmware are examples of logic. In general, logic may comprise combinations of software, hardware, and/or firmware.

Those skilled in the art will appreciate that logic may be distributed throughout one or more devices, and/or may be comprised of combinations of instructions in memory, processing capability, circuits, and soon. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware. The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In the conceptual sense, an arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A system for testing a plurality of types of devices, comprising:
   a first removable interface module configured to:
      interface with a first type of devices of the plurality of types of devices,
      store type information corresponding to the first type of devices of the plurality of types of devices, and
      receive media signals from the first type of devices of the plurality of types of devices; and
   a programmable multimedia format module coupleable to the first removable interface module and configured to:

determine type information corresponding to the first type of devices of the plurality of types of devices from type information obtained from the first removable interface module, and test the first type of devices of the plurality of types of devices in response to the type information corresponding to the first type of devices of the plurality of types of devices.

2. The system for testing a plurality of types of devices of claim 1, wherein the programmable multimedia format module is further configured to:

receive the media signals from the first removable interface module, and reformat the media signals to create reformatted media signals; and further comprising test/analysis logic configured to:

receive the reformatted media signals from the programmable multimedia format module, and analyze the reformatted media signals.

3. The system for testing a plurality of types of devices of claim 1, further comprising test/analysis logic configured to:

receive the media signals, and analyze the media signals.

4. The system for testing a plurality of types of devices of claim 1, further comprising a retainer through which the programmable multimedia format module is coupled to the first removable interface module.

5. The system for testing a plurality of types of devices of claim 1, further comprising a second removable interface module configured to:

interface with a second type of devices of the plurality of types of devices, receive media signals from the second type of devices of the plurality of types of devices, and store type information corresponding to the second type of devices of the plurality of types of devices.

6. The system for testing a plurality of types of devices of claim 1, further comprising a source signal selector operatively connected to the first removable interface module and configured to select test signals from a plurality of sources and provide selected test signals to the first removable interface module.

7. The system for testing a plurality of types of devices of claim 6, wherein the source signal selector further comprises an attenuator for attenuating at least one of the test signals provided to the first removable interface module.

8. The system for testing a plurality of types of devices of claim 1, wherein the interface between the first removable interface module and the first type of devices of the plurality of types of devices comprises aligned connectors that mate with each other.

9. A method for testing a device under test corresponding to one of a plurality of types of devices, comprising the steps of:

determining type information that corresponds to a device under test by reading information stored in an interface module that connects to the device under test, determining test parameters associated with the type information that corresponds to the device under test, testing the device under test using the test parameters associated with the type information that corresponds to the device under test, receiving media signals generated by the device under test, reformatting the media signals to create reformatted media signals; and providing the reformatted media signals to test/analysis logic configured to analyze the reformatted media signals.

10. The method for testing a device under test of claim 9, further comprising the step of instructing a source signal selector to provide source signals from a signal source of a plurality of signal sources.

11. A system for testing a plurality of types of devices, comprising:

a first removable interface module configured to:

interface with a first type of devices of the plurality of types of devices, store type information corresponding to the first type of devices of the plurality of types of devices, and receive media signals from the first type of devices of the plurality of types of devices;

a programmable multimedia format module coupleable to the first removable interface module and configured to:

determine type information corresponding to the first type of devices of the plurality of types of devices from the type information stored in the first removable interface module, test the first type of devices of the plurality of types of devices in response to the type information corresponding to the first type of devices of the plurality of types of devices, receive the media signals from the first removable interface module; and a source signal selector operatively connected to the first removable interface module and configured to select test signals from a plurality of sources and provide selected test signals to the first removable interface module.

12. The system for testing a plurality of types of devices of claim 11, wherein the programmable multimedia format module is further configured to reformat the media signals to create reformatted media signals, and further comprising:

test/analysis logic configured to:

receive the reformatted media signals from the programmable multimedia format module, and analyze the reformatted media signals.

13. The system for testing a plurality of types of devices of claim 11, wherein the source signal selector further comprises an attenuator for attenuating at least one of the test signals provided to the first removable interface module.

14. The system for testing a plurality of types of devices of claim 11, further comprising a retainer through which the programmable multimedia format module is coupled to the first removable interface module.

15. The system for testing a plurality of types of devices of claim 11, further comprising a slide rack for receiving a device under test and slidably engaging the device under test with the first removable interface module.

16. A method for testing a device under test corresponding to one of a plurality of types of devices, comprising the steps of:

determining type information that corresponds to a device under test by reading information stored in the device under test, determining test parameters associated with the type information that corresponds to the device under test, testing the device under test using the test parameters associated with the type information that corresponds to the device under test, receiving media signals generated by the device under test, reformatting the media signals to create reformatted media signals; and providing the reformatted media signals to test/analysis logic configured to analyze the reformatted media signals.

17. The method for testing a device under test of claim 16, further comprising the step of instructing a source signal selector to provide source signals from a signal source of a plurality of signal sources.

* * * * *